(12) United States Patent
Ciappa et al.

(10) Patent No.: US 12,726,186 B2
(45) Date of Patent: Sep. 1, 2026

(54) THRESHOLD GENERATION CIRCUIT, CORRESPONDING SYSTEM AND METHOD

(71) Applicant: STMicroelectronics International N.V., Geneva (CH)

(72) Inventors: Francesco Ciappa, Turin (IT); Alberto Bianco, Aosta (IT); Riccardo Peloso, Aosta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/921,440

(22) Filed: Oct. 21, 2024

(65) Prior Publication Data

US 2025/0167775 A1 May 22, 2025

(30) Foreign Application Priority Data

Nov. 22, 2023 (IT) ........................ 102023000024732

(51) Int. Cl.
*H03K 5/02* (2006.01)
*H03K 4/06* (2006.01)

(52) U.S. Cl.
CPC ................. *H03K 5/02* (2013.01); *H03K 4/06* (2013.01)

(58) Field of Classification Search
CPC ....... H03K 5/02; H03K 4/06; H02M 3/33523; H02M 1/0035; H02M 1/0025
See application file for complete search history.

(56) References Cited

U.S. PATENT DOCUMENTS 6,946,753 B2 9/2005 Kernahan
2007/0176588 A1 8/2007 Nishida
2009/0085619 A1 4/2009 Westwick
2010/0039836 A1 2/2010 Gong
2011/0096573 A1 4/2011 Zhu et al.
2012/0206944 A1 8/2012 Yang et al.
2014/0184252 A1 7/2014 Jefferies
2019/0079573 A1 3/2019 Hanson
2020/0042076 A1 2/2020 Idgunji
2025/0119677 A1 * 4/2025 Wong .................. H04R 1/1008

FOREIGN PATENT DOCUMENTS

EP 2717450 A1 4/2014

* cited by examiner

*Primary Examiner* — Metasebia T Retebo
(74) *Attorney, Agent, or Firm* — Slater Matsil, LLP

(57) ABSTRACT

The disclosure pertains to adaptive wake-up threshold generation in variable power supplies, particularly applicable to USB-PD chargers and wireless charging devices with digital controllers. It addresses the problem of power consumption during zero-load conditions in burst mode operation. The invention comprises a circuit with a processor, a GPIO pin, and a wake-up threshold generator. The processor drives a signal generator in burst mode, alternating between wake-up phases and waiting intervals. The GPIO pin is set to different states based on the wake-up threshold's relation to predefined bounds. The wake-up threshold generator adjusts the threshold in response to the GPIO pin's state. This adaptive approach enables efficient power management by allowing deep sleep during waiting times while maintaining responsiveness to varying output voltages, thus improving overall system efficiency in variable power supply applications.

20 Claims, 4 Drawing Sheets

WUP
+
-
Vth
18
18R
18C
Vout
K
P
24
22
HZ
GPO
14
ADC
16
ADC
26
GPI
10
100

THRESHOLD GENERATION CIRCUIT, CORRESPONDING SYSTEM AND METHOD

CROSS-REFERENCE TO RELATED APPLICATIONS

This application claims priority to Italian Application No. 102023000024732, filed on Nov. 22, 2023, which application is hereby incorporated by reference herein in its entirety.

TECHNICAL FIELD

The description relates to generating adaptive thresholds. Embodiments of the present description are applicable to variable power supplies such as USB-PD chargers/power supplies with a digital controller. Embodiments of the present description are applicable to wireless charging devices, for instance.

BACKGROUND

A digital controller operating in a burst mode consumes power even at zero load: a strategy of deep sleep is desirable during the "waiting time" between switching time and wakeup. An analog comparator can wake up the system with multiple thresholds for different voltages involved in the case of variable output applications. For instance, a comparator for a set of typical voltages can be used, while keeping out all non-standard voltages.

Document US 2009/085619 A1 discloses a single-chip microcontroller unit that includes a processing unit with a normal and low-power mode of operation. Analog circuitry and digital circuitry are connected to the processing unit. Monitoring circuitry determines if a chip supply voltage level exceeds a threshold level necessary to maintain the operation of the digital circuitry.

Document US 2014/184252 A1 discloses a system to detect whether a potentiometer is in an open circuit condition. The system includes a potentiometer with a resistive element coupled between a voltage input and ground and an adjustable arm that determines the resistance of the resistive element. A low pass filter is coupled to the adjustable arm. A controller has a first driver output coupled to the voltage input of the potentiometer and a second driver output coupled to the adjustable arm. The controller determines the failure of the potentiometer by setting the first driver output coupled to the voltage input of the potentiometer to a high value. A first sample voltage from the adjustable arm is read and determined whether the first sample voltage is between a high threshold and a low threshold value. The first driver output coupled to the voltage input of the potentiometer is set to a low value. A voltage is applied to the adjustable arm via the second driver output. A second sample is read from the adjustable input and it is determined whether the second sample is below an arm threshold value.

Other general information in the same technological area can be gathered from documents such as US 2010/039836 A1, US 2019 079573 A1, US 2020/042076 A1, or U.S. Pat. No. 6,946,753 B2.

Approaches as discussed in the foregoing may suffer from various drawbacks: trimming each threshold separately is time-consuming; the semiconductor (silicon) area increases with the number of thresholds: some applications, such as USB Power Delivery Programmable Power Supply (USB PD PPS), for instance, may notionally require even 800 thresholds to cover an entire desired range of operation; or more power can be consumed with zero load at certain output voltages.

SUMMARY

An object of one or more solutions is to contribute in addressing the issues discussed in the foregoing.

According to one or more solutions, such an object can be achieved by a circuit having the features set forth in the claims that follow. One or more solutions relate to a corresponding system.

For instance, a variable power supply, such as a USB-PD charger/power supply with a digital controller for wireless charging devices, may be exemplary of such a system.

One or more solutions relate to a corresponding method. The claims are an integral part of the technical teaching provided herein in respect of the solutions.

Solutions as described herein are suited for precise or variable burst threshold generation and facilitate shut down and "burst in deep sleep" operation at every output voltage.

Solutions as described herein are advantageous over more expensive alternative solutions.

Solutions, as described herein, may rely on a combination of a circuit (comparator plus discrete components) and a "pin and closed loop" procedure wherein a voltage on an I/O pin is measured (continuously), and a loop is closed according to the value read by an analog-to-digital converter, ADC for instance.

Solutions described herein can be integrated into an integrated circuit (IC) and possibly be ported into a fully analog circuit.

In solutions as described herein: an RC filter can filter a general-purpose output, GPO value for generating a threshold; an analog-to-digital converter, ADC reads the value during a high-impedance, HZ period; a GPO is driven high or low to change it in response to a threshold being increased or decreased.

This arrangement shows low consumption as the GPO is mostly in a high-impedance (HZ) state, topping up only the energy loss by capacitance parasitic.

An advantageous solution may involve (only) one dedicated pin, assuming that an output voltage Vout is read anyway.

As described herein, solutions may involve a capacitor to create an offset Vcap between Vout and the voltage on a general-purpose input-output GPIO pin. For instance, that offset can be measured by measuring both the output and GPIO voltage simultaneously through an analog-to-digital converter (ADC).

A wakeup threshold Wwup can thus be defined as Wwup=Vth+Vcap based on a value of the comparator threshold Vth that can be arbitrary (it could even be unknown). The capacitor can be charged or discharged at a voltage Vcap until the comparator output triggers. At that time, the output voltage can be measured to calculate a triggering point called the output. The capacitor can be charged or discharged according to the difference between the output voltage at the triggering instant and a desired wake-up threshold.

The prior art, as discussed in the foregoing, does not explicitly disclose an RC circuit filtering a GPO value for generating a threshold with an ADC reading the filtered value (during an HZ period) as well as driving a GPO high or low to increase or decrease a threshold (if needed to be changed).

The prior art, as discussed previously, is essentially silent with respect to a capacitor creating an offset between an output voltage and a voltage on a GPIO pin, which is measured by measuring both the output voltage and the GPIO voltage at the same time through an ADC; measuring the output voltage to calculate a triggering point referred to the output; and charging or discharging the capacitor according to the difference between the output voltage at the triggering instant and a desired wake-up threshold.

Also, US 2014/184252 A1 does not even address the point of performing shutdown at any output voltage during a burst mode of operation.

BRIEF DESCRIPTION OF THE DRAWINGS

One or more solutions will now be described, by way of example only, with reference to the annexed figures, wherein:

FIG. 3 is a circuit diagram exemplary of solutions of the present description;

FIG. 6 is a circuit diagram exemplary of a possible variant of the solution of FIG. 3.

Corresponding numerals and symbols in the figures generally refer to corresponding parts unless otherwise indicated. The figures are drawn to illustrate the relevant aspects of the solutions clearly and are not necessarily drawn to scale. The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of solutions of this description. The solutions may be obtained without one or more of the specific details, or with other methods, components, materials, etc. In other cases, known structures, materials, or operations are not illustrated or described in detail so that certain aspects of solutions will not be obscured.

Reference to "a solution/embodiment" or "one solution/embodiment" in the framework of the present description is intended to indicate that a particular configuration, structure, or characteristic described in relation to the solution/embodiment is included in at least one solution/embodiment. Hence, phrases such as "in a solution/embodiment" or "in one solution/embodiment" that may be present in one or more points of the present description do not necessarily refer to one and the same solution/embodiment. Moreover, particular configurations, structures, or characteristics may be combined in any adequate way in one or more solutions/embodiments.

The headings/references used herein are provided merely for convenience and, hence, do not define the extent of protection or the scope of the solutions.

Throughout the figures annexed herein, unless the context indicates otherwise, like parts or elements are indicated with the same references/numerals and a corresponding description will not be repeated for brevity.

Also, for the sake of simplicity and ease of explanation, the same designation may be applied throughout this description to designate a certain node or line as well as a signal occurring at that node or line or a certain component (such as a capacitor or a resistor) as well as an electrical parameter thereof (capacitance or resistance/impedance, for instance).

Figure 1:
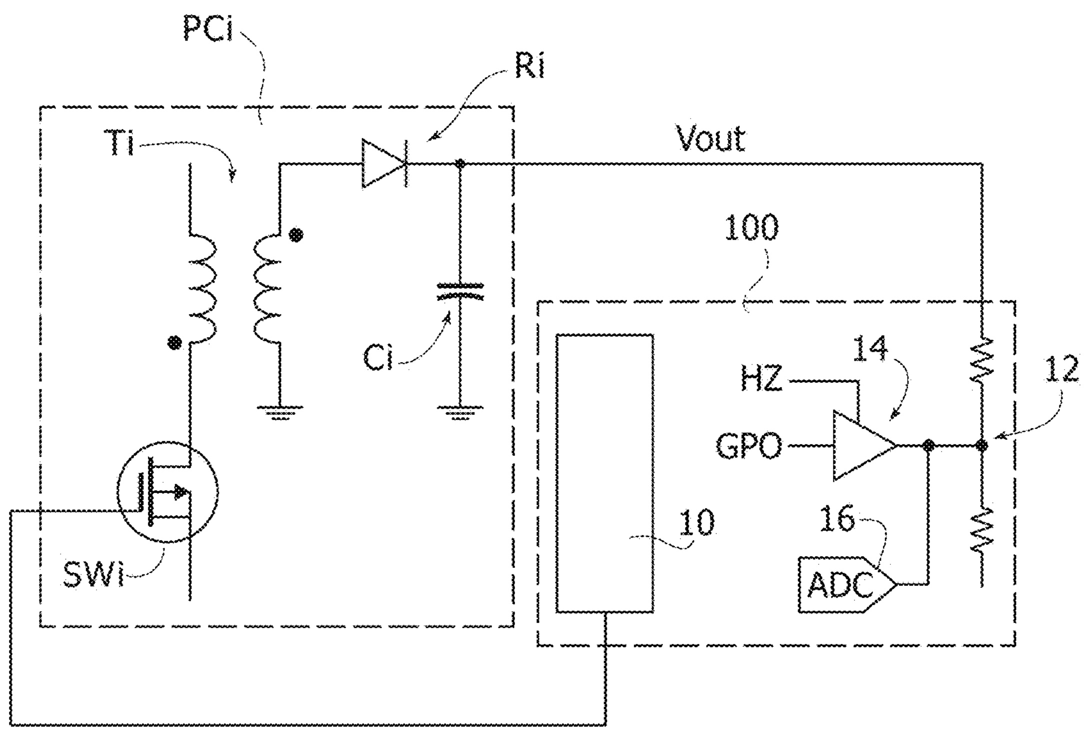
FIG. 1 is generally representative of architecture where solutions of the present description can be applied.

FIG. 1 generally represents architecture where solutions of the present description can be applied. In such architecture, microcontroller circuitry 100 built around a microprocessor 10, for instance, controls one or more power components PCi (i=1, . . . , N).

These power components PCi are represented here—merely by way of a non-limiting example—by a transformer Ti having associated a rectifier Ri (represented simply as a diode) that provides an output voltage Vout across an output capacitor Ci (this can be regarded as exemplary of a load not fully visible for simplicity).

Switching circuitry SWi (one or more MOSFET transistors, for instance) coupled to the transformer Ti is configured to be switched on (conductive) and off (non-conductive) under the control of the microcontroller circuitry 100.

For example, the microprocessor 10 may read the voltage Vout (e.g., via a scale-down voltage divider 12) and perform loop compensation in driving the switch elements' control terminal(s) in the switching circuitry SWi.

To that effect, the microprocessor 10 may be provided with a general-purpose pin, such as a pin referenced as 14 with an associated analog-to-digital converter, ADC 16 coupled to the output node from the voltage divider 12.

As discussed so far, the structure and operation of such architecture are conventional in the art, making it unnecessary to provide a more detailed description herein.

Those of skill in the art will otherwise easily appreciate that FIG. 1 is a deliberately simplified representation of various digital architectures where solutions of the present description can be applied. Embodiments of the present description are primarily concerned with circuitry and procedures for handling low-power operation in a burst mode in such digital architectures rather than with possible implementation details of these architectures.

Figure 2:
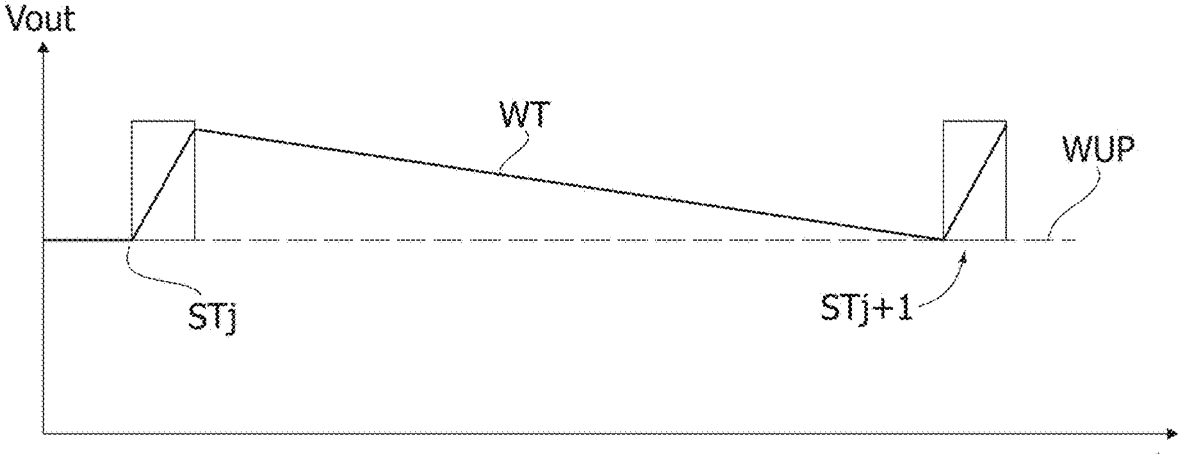
FIG. 2 is a time diagram exemplary of possible time behavior of an output voltage in burst mode operation of such architecture.

Architecture, as exemplified in FIG. 1, can be operated in a burst mode, as illustrated in FIG. 2, with the output voltage Vout rising in response to switching at a switching time STj and then decreasing over a waiting time interval WT while waiting for a renewed switching (wake up) at a time STj+1 in response to the voltage Vout having dropped over time (abscissa scale t) down to a wake-up threshold WUP.

As discussed in the introductory portion to this description, a factor to consider in implementing such a burst mode of operation lies in that a digital controller such as the controller circuitry 100 of FIG. 1 consumes power even at (notionally) zero load with the pin 14 in a high-impedance state (HZ).

An adequate "sleep" strategy is desirable during the waiting time WT between switching and wakeup times STj, STj+1, . . . when operating in a burst mode. For example, an analog comparator can wake up the system with multiple thresholds for different voltages involved in the case of variable output applications.

As discussed in the foregoing, such an approach may end up being unsatisfactory for various reasons (for example, each threshold being separately trimmed is time-consuming;

semiconductor area increases with an increasing number of thresholds; a very high number of thresholds involved in covering an entire desired range of operation; or more power consumed at zero load for certain output voltages).

Figure 3:
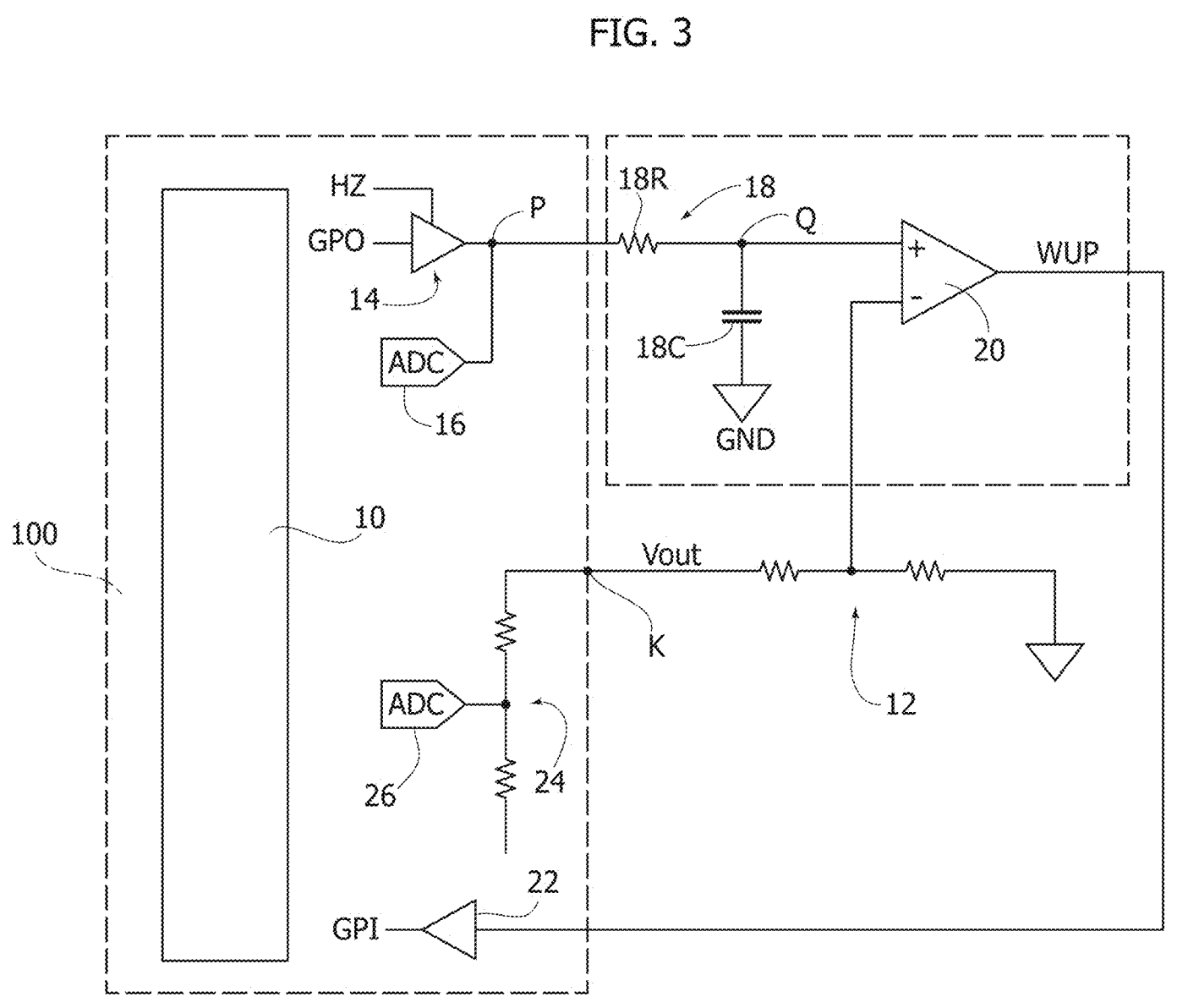
Figure 4:
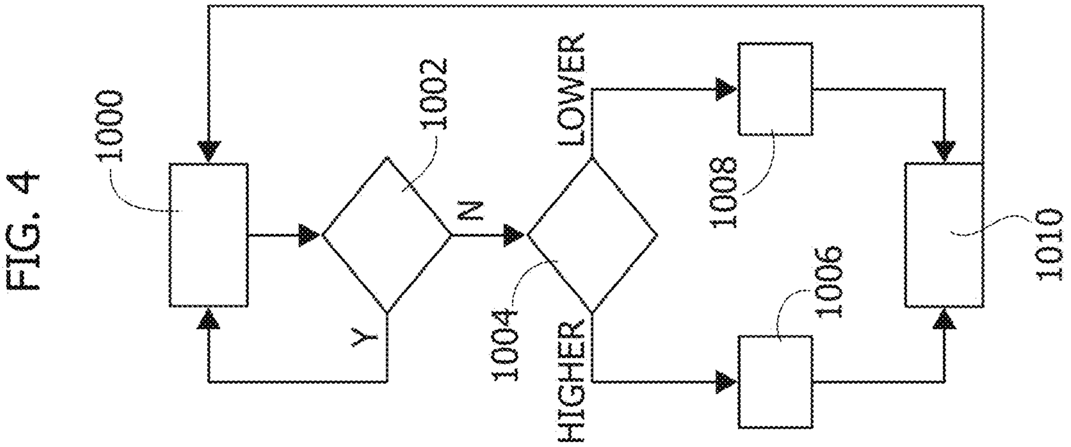
FIG. 4 is a flow-chart illustrative of a procedure according to solutions of the present description.

FIG. 3 is a circuit diagram exemplary of solutions according to the present description that can be operated based on the procedure exemplified by the flow chart of FIG. 4. As exemplified in FIG. 3, in solutions according to the present description, in the microcontroller 100 of FIG. 1 (this figure may still be referred to in connection with architecture where solutions of the present description can be applied), the general-purpose pin 14 and the associated analog-to-digital converter, ADC 16 are still intended to co-operate with a voltage divider 12 configured to scale down the output voltage Vout (assumed to be present at a node K).

In the case exemplified in FIG. 3, additional circuitry can be provided (this is shown as an "external" circuitry for simplicity, but in various embodiments, it can be integrated), including an RC low-pass filter 18 comprising a resistor 18R and a capacitor 18C.

As illustrated, the resistor 18R is coupled between node P, where the ADC 16 is coupled to the general-purpose pin 14, and node Q with the capacitor 18C coupled between node Q and ground GND.

The node Q is coupled to one of the inputs (a "+" input, for instance) of a comparator 20 whose other input (a "−" input, for instance, acting as a threshold) is coupled to the output node of the voltage divider 12 that senses the voltage Vout (at node K).

The output of the comparator 20 provides a (variable) wake-up threshold WUP that can be applied to the microprocessor 10 at a general-purpose (input) pin 22. For reasons that will become clearer in the following, in FIG. 3, the voltage Vout is also assumed to be sensed (detected) via a scale-down voltage divider 24 to a general-purpose input, GPI pin 26 of the microprocessor 10.

The blocks in the flow-chart of FIG. 4 are exemplary of steps or phases in a possible procedure for operating the circuit exemplified in FIG. 3 that can be implemented under the control of the microprocessor 10. The blocks in the flow-chart of FIG. 4 are exemplary of steps or phases as described in the following. Block 1000: the GPO pin 14 is set to a high-impedance (HZ) state, and the GPO voltage is read via the ADC 16.

Block 1002 checks whether the (current) threshold (at a level WUP) is within the desired boundaries. Advantageously, this does not involve a defined starting value. For instance, one may start with a low threshold that can be increased until a correct value is reached. In that phase, a low consumption mode may not be available with the voltage across the ADC converter adjusted (not the comparator 20). Check 1002 can be performed by putting pin 14 in a high-impedance (HZ) state and reading the voltage at node P through ADC converter 16. If the threshold WUP is checked to be within desired boundaries (positive outcome, YES of the check 1002), return to step 1000;

Block 1004: In response to a negative outcome, there is NO of the check in block 1002. A further check is made whether the current threshold WUP is higher than the upper desired bound or boundary or lower than the lower desired bound or boundary. The check of block 1004 can be again performed (like the check of block 1002) by putting pin 14 in a high-impedance HZ state and reading the voltage at node P through the ADC converter 16.

Block 1006: in response to the threshold WUP being found in block 1004 to be higher than the upper desired bound, pin 14 is set to low via the microprocessor 10, whereby the threshold WUP is lowered in response to the (low) GPO value filtered by the RC filter 18 being applied to the (here, positive) input of the comparator 20;

Block 1008: in response to the threshold WUP being found in block 1004 to be lower than the lower desired bound, the GPO 14 is set to high via the microprocessor 10, whereby the threshold WUP is increased in response to the (high) GPO value filtered by the RC filter 18 being applied to the input of the comparator 20;

Block 1010: a waiting time T is set, after which the operation returns to step 1000.

In arrangements as discussed herein, the comparator 20 can operate as a normal burst comparator: for instance, the comparator 20 can be configured so that, in response to Vout is lower than the actual threshold WUP, a new burst is performed, and afterward, the system can be put in low power mode.

The flow-chart FIG. 4 corresponds to a finite state machine (FSM) implementation that can be synchronized with the switching activities and kept in a hold state during a low power mode to save as much power as possible.

In response to being operated with the procedure exemplified in the flow-chart of FIG. 4, the circuit of FIG. 3 facilitates generating (and detecting) a variable threshold WUP with the RC network 18 that filters the GPO value; this is read during the high-impedance, HZ period and the threshold WUP increased or decreased in response to the GPO pin being driven high or low to change the threshold.

As noted, GPO 14 is usually in a high impedance state with reduced consumption (this is topped up only by the energy loss due to parasitic in the capacitor 18C).

Figure 5:
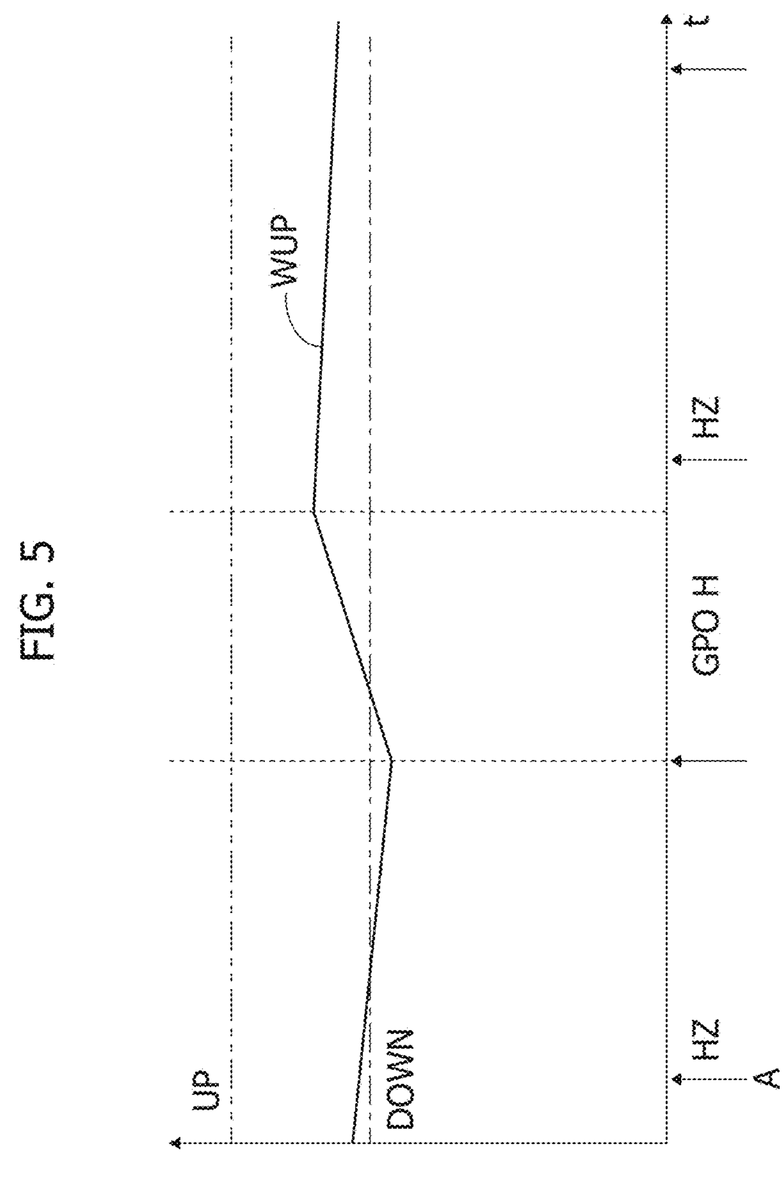
FIG. 5 is a timing diagram exemplary of the possible time behavior of a wake-up threshold in solutions of the present description.

The diagram of FIG. 5 shows how architecture, as exemplified in FIG. 3, can be operated (essentially as illustrated in FIG. 4) in a steady state with a GPO wakeup threshold WUP variable having regard to an upper limit UP and a lower limit DOWN.

The diagram of FIG. 5 (where the operation timing scale t is not respected for ease of explanation) shows a possible behavior over time (abscissa scale t) of a threshold WUP that, in the example illustrated, decreases at first in a HZ state—left-hand side of the diagram) towards and possibly below a lower bound DOWN and then increases as a result of the GPO pin 14 having being set to "high" (GPO H) in response to the threshold WUP (as sampled at a time A) being lower than the lower desired bound DOWN (block 1008 in the flow-chart of FIG. 4).

A complementary possible behavior over time (not visible for simplicity) may be a threshold WUP that at first increases towards and possibly above an upper bound UP and then decreases as a result of the GPO pin 14 having being set to "low" in response to the threshold WUP being higher than the upper desired bound UP (block 1006 in the flow-chart of FIG. 4).

The diagram of FIG. 5 can be read in conjunction with the diagram of FIG. 2, where the output voltage Vout is shown: rising in response to switching at a switching time STj to increase over a wake-up threshold WUP that can be "conditioned", namely varied using a circuit as illustrated in FIG. 3, and decreasing, waiting for a new wakeup at time STj+1 with the GPO 14 kept in a low-consumption HZ state until the output voltage Vout drops at the wakeup threshold WUP to rise anew in response to switching at a switching time STj+1.

Figure 6:
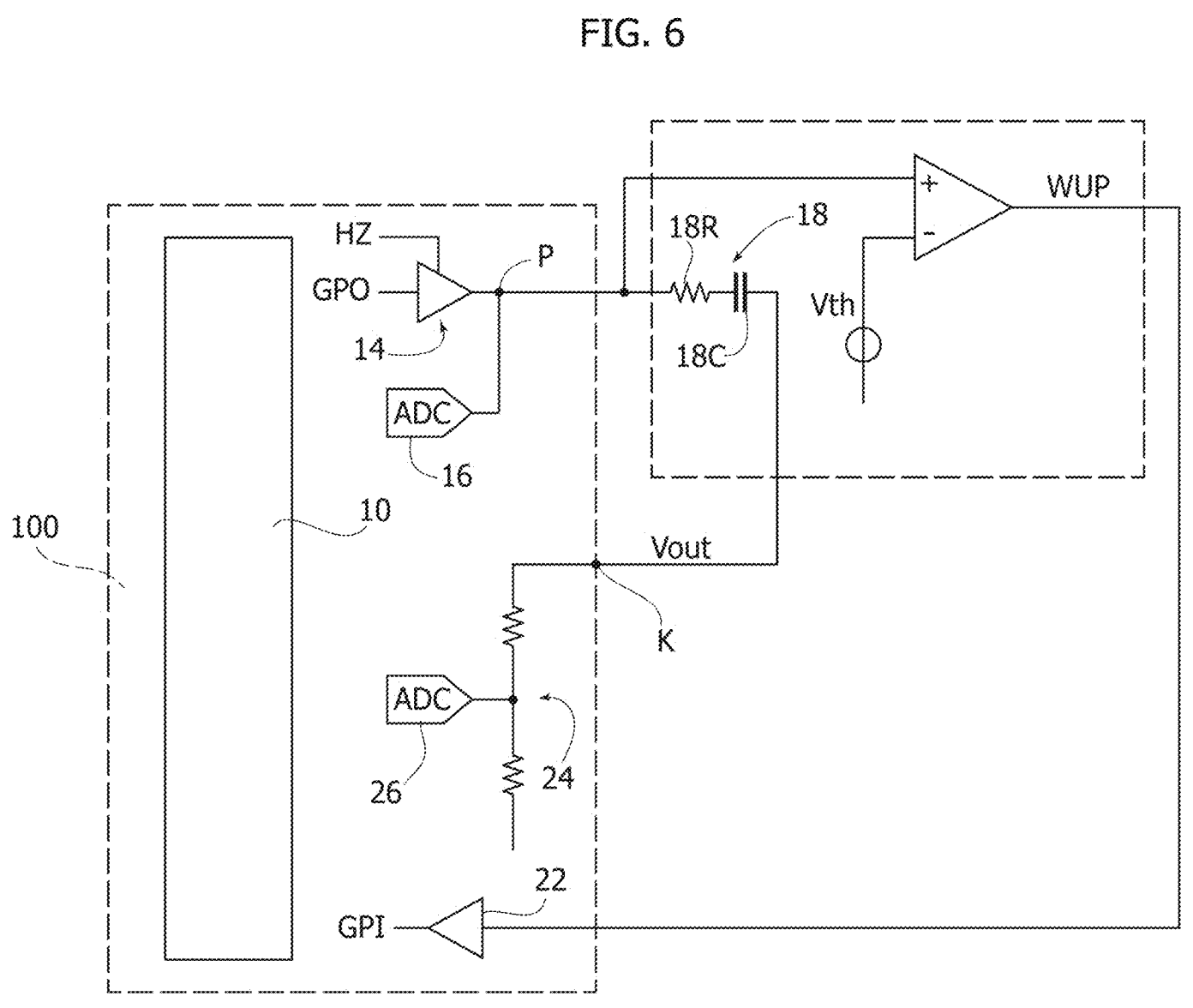

FIG. 6 is a circuit diagram exemplary of a possible variant of the solution of FIG. 3. In FIG. 6, corresponding reference symbols/numbers indicate parts or elements corresponding to parts or elements already discussed in connection with the previous figures: a detailed description of these parts or elements will not be repeated for brevity.

In comparison with the circuit of FIG. 3, the circuit of FIG. 6 involves just one "dedicated" GPO pin 14 (assuming that Vout is read anyway via the ADC 26 coupled to the divider 24) with a series connection of a resistor 18R and a capacitor 18C arranged between the node K (namely, the voltage Vout) and the node P (GPO pin 14, input to the comparator 20).

The capacitor 18C thus creates an offset between the voltage Vout and the voltage on the GPO pin. That offset can be measured by measuring the output voltage Vout and the GPO voltage. This may take place at the same time through ADC converters 16 and 26.

In the circuit of FIG. 6, a threshold Vwup for the wakeup can thus be expressed as Vwup=Vth+Vcap where Vcap is a voltage across the capacitor 18C, and Vth is the threshold value applied to the comparator 20.

Here again, the comparator 20 has the same task of detecting an output voltage Vout below the threshold WUP. In this case, an AC part of the output voltage can be applied (to the comparator 20 (to the non-inverting input, for instance) through 18R and 18C. A DC component can then be added via the GPO pin 14. The other input (the inverting input, for instance) of the comparator 20 can be set to a fixed voltage, and the finite state machine (FSM) implementation of the flow chart of FIG. 4 will again apply to this arrangement.

It is noted that the threshold can be arbitrary or even unknown: in that case, the capacitor 18C can be charged or discharged until the output of the comparator 20 triggers.

At that instant, the output voltage Vout can be measured to calculate the triggering point referred to as the output. In the circuit of FIG. 6, the capacitor 18C will be charged or discharged according to the difference between the output voltage at the triggering instant and the desired wake-up threshold.

Without prejudice to the underlying principles, the details and solutions may vary, even significantly, with respect to what has been described by example only, without departing from the extent of protection. The extent of protection is determined by the annexed claims.

What is claimed is:

1. A circuit for generating an adaptive wake-up threshold, the circuit comprising:
- a processor;
- a general-purpose input/output (GPIO) pin; and
- a wake-up threshold generator,
- wherein the processor is configured to:
  - drive a signal generator in a burst mode of operation, the burst mode comprising alternating wake-up phases and waiting time intervals, wherein the signal generator is switched on to cause a pulsed output signal at an output node of the signal generator to rise during a wake-up phase, wherein the signal generator is switched off and the pulsed output signal decreases over time during a waiting time interval following the wake-up phase, and wherein a subsequent wake-up phase is initiated in response to the pulsed output signal decreasing to a wake-up threshold during the waiting time interval, wherein the pulsed output signal decreases due to a discharge of a capacitive load coupled to the output node of the signal generator,
  - set the GPIO pin to a high-impedance state during the waiting time intervals,
  - read a value of the GPIO pin during the waiting time intervals,
  - set the GPIO pin to a first value in response to the wake-up threshold being found to be higher than an upper bound, and
  - set the GPIO pin to a second value in response to the wake-up threshold being found to be lower than a lower bound,
- wherein the wake-up threshold generator is coupled to the GPIO pin and configured to:
  - decrease the wake-up threshold in response to the GPIO pin being set to the first value, and
  - increase the wake-up threshold in response to the GPIO pin being set to the second value.

2. The circuit of claim 1, wherein the wake-up threshold generator comprises a comparator configured to increase or decrease the wake-up threshold based on a comparison of a representation of the value of the GPIO pin and the output signal from the signal generator.

3. The circuit of claim 2, comprising a low-pass filter coupled between the GPIO pin and the comparator, wherein the representation of the value of the GPIO pin is a low-pass filtered replica of the value of the GPIO pin.

4. The circuit of claim 1, wherein the wake-up threshold generator comprises a comparator configured to increase or decrease the wake-up threshold based on a comparison of an offset replica of the output signal from the signal generator and a comparator threshold.

5. The circuit of claim 4, comprising an offset capacitor coupled between the GPIO pin and a node, the node configured to have applied thereto the output signal from the signal generator, wherein the charge across the offset capacitor provides the offset replica of the output signal.

6. The circuit of claim 1, wherein the first value corresponds to a logical low state of the GPIO pin, and wherein the second value corresponds to a logical high state of the GPIO pin.

7. The circuit of claim 6, wherein setting the GPIO pin to the first value causes the wake-up threshold generator to decrease the wake-up threshold, and wherein setting the GPIO pin to the second value causes the wake-up threshold generator to increase the wake-up threshold.

8. A system for generating an adaptive wake-up threshold, the system comprising:
- a signal generator;
- a processor;
- a general-purpose input/output (GPIO) pin; and
- a wake-up threshold generator,
- wherein the processor is configured to:
  - drive the signal generator in a burst mode of operation, the burst mode comprising alternating wake-up phases and waiting time intervals, wherein the signal generator is switched on to cause a pulsed output signal at an output node of the signal generator to rise during a wake-up phase, wherein the signal generator is switched off and the pulsed output signal decreases over time during a waiting time interval following the wake-up phase, and wherein a subsequent wake-up phase is initiated in response to the pulsed output signal decreasing to a wake-up threshold during the waiting time interval, wherein the pulsed output signal decreases due to a discharge of a capacitive load coupled to the output node of the signal generator,
  - set the GPIO pin to a high-impedance state during the waiting time intervals, read a value of the GPIO pin during the waiting time intervals, set the GPIO pin to a first value in response to the wake-up threshold being found to be higher than an upper bound, and set the GPIO pin to a second value in response to the wake-up threshold being found to be lower than a lower bound, wherein the wake-up threshold generator is coupled to the GPIO pin and configured to:

decrease the wake-up threshold in response to the GPIO pin being set to the first value, and increase the wake-up threshold in response to the GPIO pin being set to the second value.

9. The system of claim 8, wherein the wake-up threshold generator comprises a comparator configured to increase or decrease the wake-up threshold based on a comparison of a representation of the value of the GPIO pin and the pulsed output signal from the signal generator.

10. The system of claim 9, comprising a low-pass filter coupled between the GPIO pin and the comparator, wherein the representation of the value of the GPIO pin is a low-pass filtered replica of the value of the GPIO pin.

11. The system of claim 8, wherein the wake-up threshold generator comprises a comparator configured to increase or decrease the wake-up threshold based on a comparison of an offset replica of the pulsed output signal from the signal generator and a comparator threshold.

12. The system of claim 11, comprising an offset capacitor coupled between the GPIO pin and a node, the node configured to have applied thereto the pulsed output signal from the signal generator, wherein the charge across the offset capacitor provides the offset replica of the pulsed output signal.

13. The system of claim 8, wherein the first value corresponds to a logical low state of the GPIO pin, and wherein the second value corresponds to a logical high state of the GPIO pin.

14. The system of claim 13, wherein setting the GPIO pin to the first value causes the wake-up threshold generator to decrease the wake-up threshold, and wherein setting the GPIO pin to the second value causes the wake-up threshold generator to increase the wake-up threshold.

15. A method for generating an adaptive wake-up threshold, the method comprising:

driving a signal generator in a burst mode of operation, the burst mode comprising alternating wake-up phases and waiting time intervals, wherein during a wake-up phase, the signal generator is switched on to cause a pulsed output signal to rise, during a waiting time interval following the wake-up phase, the signal generator is switched off and the pulsed output signal decreases over time, and a subsequent wake-up phase is initiated in response to the pulsed output signal decreasing to a wake-up threshold during the waiting time interval, wherein the pulsed output signal decreases due to a discharge of a capacitive load coupled to an output node of the signal generator;

setting a general-purpose input/output (GPIO) pin to a high-impedance state during the waiting time intervals;

reading a value of the GPIO pin during the waiting time intervals;

setting the GPIO pin to a first value in response to the wake-up threshold being found to be higher than an upper bound;

setting the GPIO pin to a second value in response to the wake-up threshold being found to be lower than a lower bound;

decreasing the wake-up threshold in response to the GPIO pin being set to the first value; and increasing the wake-up threshold in response to the GPIO pin being set to the second value.

16. The method of claim 15, further comprising comparing a representation of the value of the GPIO pin and the pulsed output signal to determine whether to increase or decrease the wake-up threshold.

17. The method of claim 16, further comprising low-pass filtering the value of the GPIO pin to generate the representation of the value of the GPIO pin.

18. The method of claim 15, further comprising comparing an offset replica of the pulsed output signal and a comparator threshold to determine whether to increase or decrease the wake-up threshold.

19. The method of claim 18, further comprising generating the offset replica of the pulsed output signal using an offset capacitor coupled between the GPIO pin and a node, the node having applied thereto the pulsed output signal.

20. The method of claim 15, wherein the first value corresponds to a logical low state of the GPIO pin, the second value corresponds to a logical high state of the GPIO pin, setting the GPIO pin to the first value causes the wake-up threshold to decrease, and setting the GPIO pin to the second value causes the wake-up threshold to increase.

* * * * *